United States Patent [19]

Sugimoto

[11] Patent Number: 4,785,246
[45] Date of Patent: Nov. 15, 1988

[54] MAGNETIC RESONANCE IMAGING APPARATUS

[75] Inventor: Hiroshi Sugimoto, Tochigi, Japan

[73] Assignee: Kabushiki Kaisha Toshiba, Kawasaki, Japan

[21] Appl. No.: 877,381

[22] Filed: Jun. 23, 1986

[30] Foreign Application Priority Data

Jun. 26, 1985 [JP] Japan .................. 60-139361

[51] Int. Cl.$^4$ ........................................... G01R 33/20
[52] U.S. Cl. ...................................... 324/318; 324/322
[58] Field of Search ....................... 324/318, 311, 322; 128/653; 336/84 C, 84 M

[56] References Cited

U.S. PATENT DOCUMENTS 4,564,812  1/1986  Van Dijk ........................... 324/318
4,642,569  2/1987  Hayes et al. ....................... 324/318

FOREIGN PATENT DOCUMENTS 0071896  2/1983  European Pat. Off. ............ 128/653
3131946  3/1983  Fed. Rep. of Germany .
3133432  3/1983  Fed. Rep. of Germany .
3445724  6/1985  Fed. Rep. of Germany .

OTHER PUBLICATIONS

"NMR Imaging in Biomedicine", compiled by P. Mansfield and P. G. Morris, Academic Press, 1982, pp. 275-289.

Primary Examiner—Stewart J. Levy
Assistant Examiner—Louis M. Arana
Attorney, Agent, or Firm—Foley & Lardner, Schwartz, Jeffery, Schwaab, Mack, Blumenthal & Evans

[57] ABSTRACT

Disclosed is a magentic resonance imaging apparatus which comprises a transmission probe head, a reception probe head, and inclined magnetic field coil means. The transmission probe head applies a high-frequency magnetic field to a subject, while the reception probe head receives magnetic resonance signals from the subject. The inclined magnetic field coil means generates and applies an inclined magnetic field to the subject. If the inclined magnetic field is applied to the subject, the magnetic resonance signals detected by the reception probe head are provided with generative position information. An electromagnetic coupling prevention member is interposed between the coil means and the transmission and reception probe heads. The prevention member includes a plurality of high-conductivity portions and a plurality of electrically discontinuous portions electrically separating the high-conductivity portions from one another.

4 Claims, 5 Drawing Sheets

MAGNETIC RESONANCE IMAGING APPARATUS

BACKGROUND OF THE INVENTION

The present invention relates to a magnetic resonance imaging apparatus (MRI apparatus) such as a diagnostic magnetic resonance imaging apparatus which utilizes a magnetic resonance effect for externally determining the density distribution, relaxation time distribution, and chemical shift of specific atomic nuclei (normally hydrogen nuclei) in various tissues of a living body, as a subject, in a noncontacting manner, thereby providing image information for medical diagnosis, and more specifically to a magnetic resonance imaging apparatus in which electromagnetic interference between inclined magnetic field coils and transmission and reception probe heads is reduced.

Conventionally, diagnostic magnetic resonance imaging apparatuses comprise a magnetostatic field coil, a probe head for transmission, a probe head for reception, and inclined magnetic field coils for X-, Y- and Z-directions. The magnetostatic field coil serves to generate a magnetostatic field in a predetermined direction (Z-direction). The transmission probe head applies a high-frequency magnetic field to a subject, while the reception probe head receives magnetic resonance signals from the subject. The inclined field coils generate pulsative inclined magnetic fields in three rectangular directions (X-, Y- and Z-directions) an applies them to the subject in order to discriminate the positions of signal generation and obtain a cross-sectional image of the subject.

In apparatuses of a type in which the direction (Z-direction) of the magnetostatic field (produced by the magnetostatic field coil) is in line with the body axis of the subject, the reception probe head and the inclined field coils for X- and Y-directions are each generally formed in an arcuate, saddle-shape. Since the respective arcuate portions of the saddle-shaped coils have their centers of curvature on the same axis, it is inevitable that the reception probe head and the X- and Y-direction inclined field coils are coupled electromagnetically. Therefore, the quality factor of the reception probe head is reduced, resulting in increased noise of the reception circuit. Thus, the apparatus cannot provide good quality cross-sectional image information, and fails to efficiently detect weak magnetic resonance signals from the subject.

The following two measures have conventionally been taken to meet this situation.

In a first system, four inclined magnetic field coils are arranged partially parallel to one another. As an example of this arrangement, FIG. 1 shows an apparatus stated in "NMR Imaging Biomedicine," Academic Press (1982), pp. 276, compiled by P. Mansfield and P. G. Morris.

In FIG. 1, transmission probe head 4, reception probe head 6, inclined magnetic field coil means 8 and 10 for the X- and Y-directions, respectively, and inclined magnetic field coil means (not shown) for the Y-direction are arranged inside magnetostatic field coil assembly 2.

Transmission probe head 4 is formed of a pair of saddle-shaped coils 4a, and reception probe head 6 also of a pair of saddle-shaped coils 6a. X-direction inclined field coil means 8 is formed of four rectangular coils 8a, which are arranged so that their respective inside portions are parallel to one another.

According to this configuration, electromagnetic coupling between coil means 8 and probe heads 4 and 6 can be avoided. However, the efficiency of generation of inclined magnetic fields is lower than that obtained with use of saddle-shaped coils. In apparatuses using superconductive coils, moreover, only a narrow space can be provided for the parallel location of the inside portions of coils 8a, thereby complicating coil arrangement.

In a second system, as shown in FIG. 2, electromagnetic coupling prevention member 22, i.e., a cylindrical high-conductivity member made of copper foil, is interposed between probe heads 12 and 14 (for transmission and reception, respectively), and inclined magnetic field coil means 16, 18 and 20 for X-, Y-, and Z-directions. According to this system, electromagnetic coupling between probe heads 12 and 14 and coil means 16, 18 and 20 can be reduced. However, the inclined magnetic fields, which vary pulsatively, produce eddy currents (indicated by arrow a) inside the high-conductivity member, as shown in FIG. 3, thus preventing quick rising and falling of pulses of the inclined fields.

SUMMARY OF THE INVENTION

The object of the present invention is to provide a magnetic resonance imaging apparatus which can produce a cross-sectional image of good quality, by reducing electromagnetic coupling between probe heads and inclined magnetic field coil means, and to permit quick rising and falling of pulses of the inclined magnetic fields, without a reduction in the efficiency of generation of the inclined fields, and without any problems concerning coil arrangement.

According to one aspect of the present invention, there is provided a magnetic resonance imaging apparatus which forms an image of the spin density distribution associated with relaxation time information within a subject by utilizing a magnetic resonance effect, and which comprises probe head means for applying a high-frequency magnetic field to the subject and receiving magnetic resonance signals from said subject; inclined magnetic field coil means for generating and applying an inclined magnetic field to the subject, so that the magnetic resonance signals detected by the probe head means provide spatial information when the inclined magnetic field is applied to the subject; and an electromagnetic coupling prevention member for preventing electromagnetic coupling between the probe head means and the inclined magnetic field coil means, the prevent tion member including a plurality of high-conductivity portions and a plurality of electrically discontinuous portions electrically separating the high-conductivity portions from one another.

In the magnetic resonance imaging apparatus according to the present invention, the prevention member prevents electromagnetic coupling between the probe head means and the inclined magnetic field coil means, so as to reduce electromagnetic coupling between them, thereby ensuring production of good quality cross-sectional images. Including the high-conductivity portions and the electrically discontinuous portions, the prevention member permits quick rising and falling of pulses of the inclined magnetic fields. Since the inclined field coil means need not include rectangular coils, moreover, there is neither the possibility of a reduction of the efficiency of generation of the inclined fields nor problems concerning coil arrangement.

BRIEF DESCRIPTION OF THE DRAWINGS

FIGS. 4 to 8 show a magnetic resonance imaging apparatus according to an embodiment of the present invention, in which FIG. 4 is a cutaway perspective view of the apparatus, FIG. 5 is a sectional view of the apparatus, FIGS. 6 and 7 are schematic views for illustrating the operation of the apparatus, and FIG. 8 is a sectional view showing a modification of an electromagnetic coupling prevention member used in the apparatus.

DETAILED DESCRIPTION OF THE PREFERRED EMBODIMENTS

Figure 1:
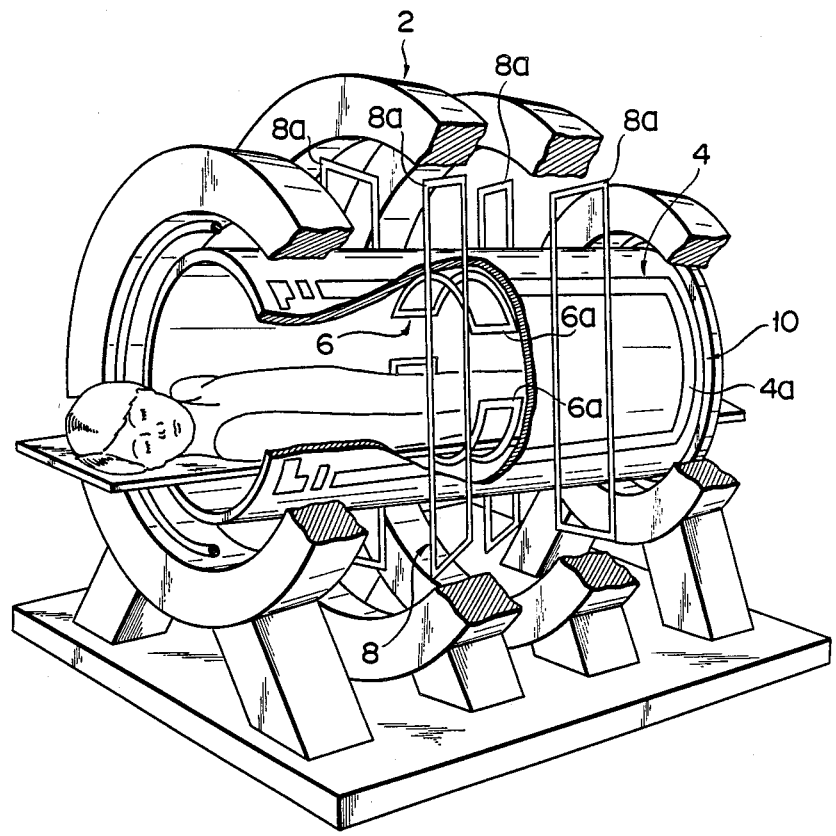
FIG. 1 is a cutaway perspective view of a prior art magnetic resonance imaging apparatus.
Figure 2:
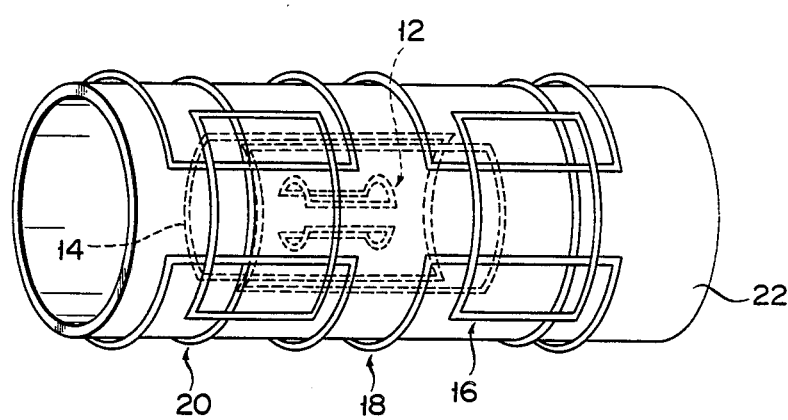
FIG. 2 is a perspective view schematically showing another prior art magnetic resonance imaging apparatus.
Figure 3:
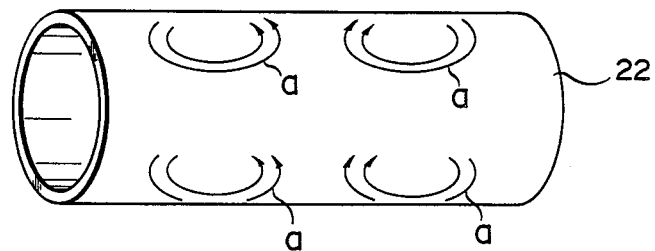
FIG. 3 is a schematic view for illustrating the operation of the apparatus of FIG. 2.

Referring now to the drawings of FIGS. 4 to 8, an embodiment of the present invention will be described in detail.

Figure 4:
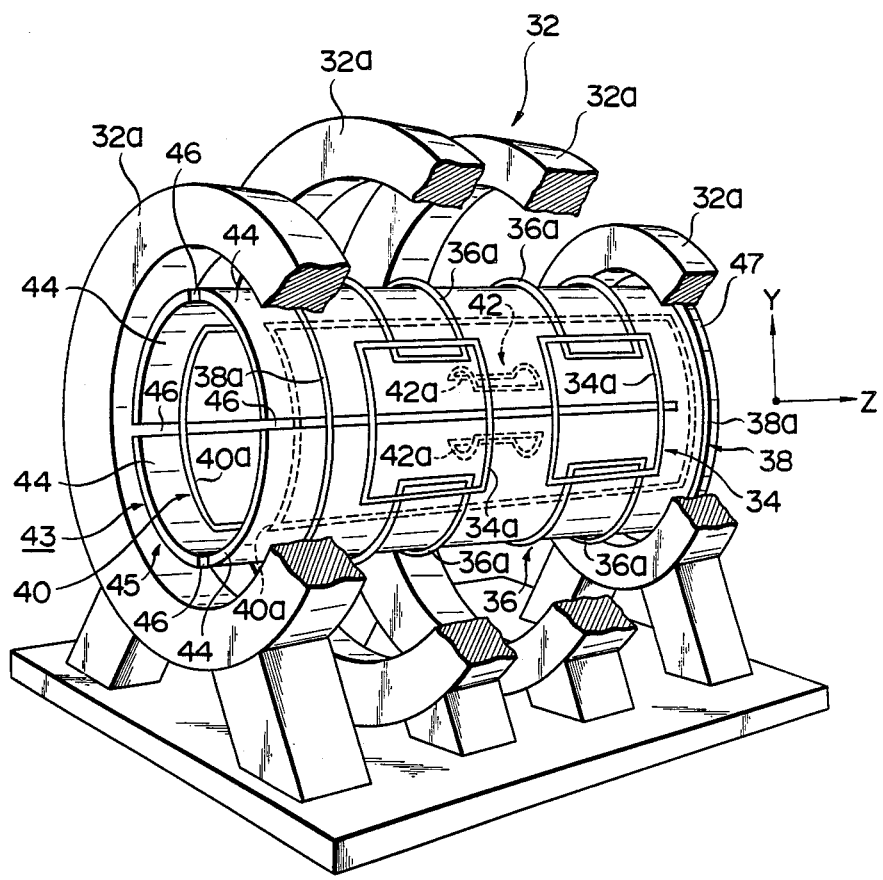
Figure 5:
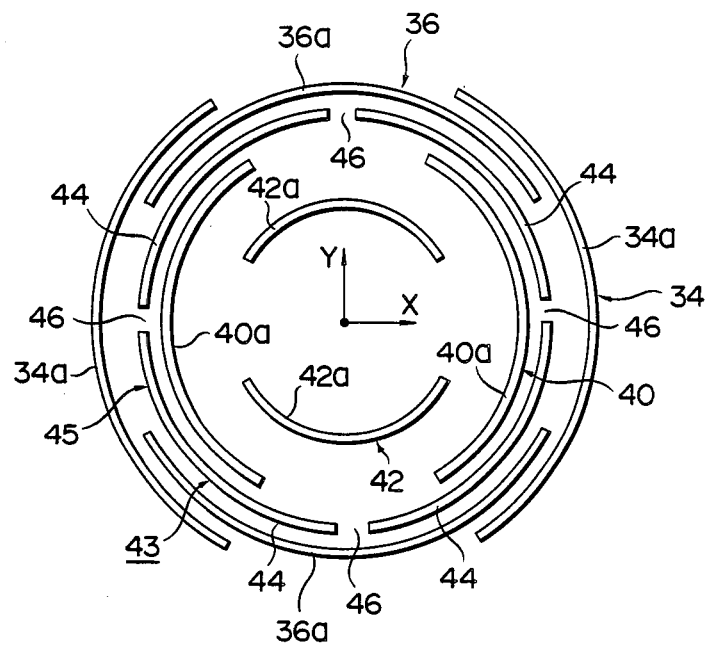
Figure 6:
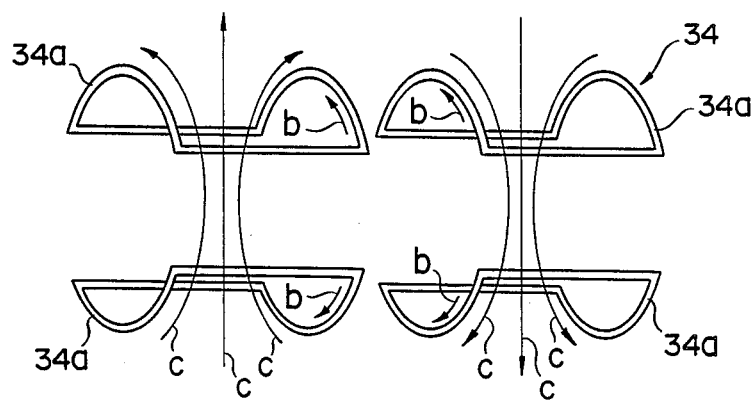
Figure 7:
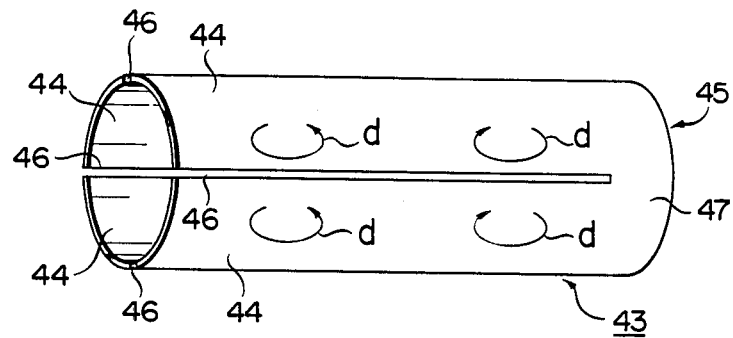

In FIGS. 4 and 5, numeral 32 designates a magnetostatic field coil assembly, such as double Helmholtz coils, including four ring-shaped coils 32a for generating a magnetostatic field in a predetermined direction (Z-direction). Inclined magnetic field coil means 34, 36 and 38 for X-, Y-, and Z-directions are arranged inside coil assembly 32. Probe head 40 for transmission and probe head 42 for reception are provided inside coil means 34, 36 and 38. A space for a subject or patient body is defined inside probe heads 40 and 42. Transmission head 40, which is formed of a pair of saddle-shaped coils 40a facing each other, serves to apply high-frequency magnetic fields to the patient body. Reception head 42, which includes a pair of saddle-shaped coils 42a facing each other, receives magnetic resonance signals from the patient body. Coil means 34, 36 and 38 serve to generate inclined magnetic fields for discriminating the positions of generation of the magnetic resonance signals, and apply the fields to the patient body. These coil means are arranged so that the directions of their magnetic fluxes are at right angles to one another. Pulsative inclined magnetic fields are generated in the three rectangular directions (X-, Y-, and Z-directions) and applied to the patient body. As a result, information on the positions of signal generation is given to the magnetic resonance signals detected by reception head 42, thus providing a desired cross-sectional image of the body. Coil means 34 and 36 for X- and Y-directions include two pairs of saddle-shaped coils 34a and two pairs of saddle-shaped coils 36a, respectively. Each two pairs are spaced in the Z-direction. Coils 34a and 36a are arranged so that a straight line connecting the centers of paired coils 34a and a straight line connecting the centers of paired coils 36a intersect at right angles on the central axis of magnetostatic field coil assembly 32. Coil means 38 for the Z-direction includes a pair of ring-shaped coils 38a. Coils 38a are spaced in the Z-direction and located outside paired coils 34a of X-direction coil means 34. Each of saddle-shaped coils 34a, 36a, 40a and 42a is in the form of a circular arc with a center angle of 120 degrees.

Electromagnetic coupling prevention member 43 is interposed between probe heads 40 and 42 and inclined magnetic field coil means 34, 36 and 38 for X-, Y-, and Z-directions. Member 43 has substantially cylindrical body 45 made of copper foil. A plurality of electrically discontinuous portions, e.g., four slits 46, are cut in the wall of body 45 at regular intervals in the circumferential direction thereof, corresponding in position to coils 34a and 36a. Slits 46 electrically separate a plurality of conductor portions 44 of body 45 from one another. These slits are formed along the central axis of body 45, extending from one end of body 45 close to the other end. Conductor portions 44 are arranged with slits 46 between them, and electrical coupling portion 47 is formed on that portion of body 45 which is not divided by slits 46. Coupling portion 47 electrically connects conductor portions 44 with one another. Portions 44 are set to ground potential.

According to this arrangement, prevention member 43 serves to reduce electromagnetic coupling between probe heads 40 and 42 and inclined magnetic field coil means 34, 36 and 38, thereby ensuring production of good quality cross-sectional images.

By including high-conductivity portions 44 and electrically discontinuous portions 46 electrically separating the same, prevention member 43 permits quick rising and falling of the pulses of the inclined magnetic fields. If current flows through the X-direction inclined field coil means 34, in the direction indicated by arrow b in FIG. 6, for example, magnetic flux in the direction of arrow c is produced by coil means 34. This magnetic flux generates eddy currents, as indicated by arrow d in FIG. 7, in high-conductivity portions 44. Electrically isolated by slits 46, portions 44 keep only local eddy currents therein, thereby preventing the flow of main eddy currents. Thus, the pulses of inclined magnetic field are free from delay in rising and falling.

In contrast with the prior art case where rectangular coils are used, X- and Y-direction inclined magnetic field coil means 34 and 36 are formed of saddle-shaped coils 34a and 36a, so that there is neither the possibility of a reduction in the efficiency of generation of the inclined fields nor problems concerning coil arrangement.

Figure 8:
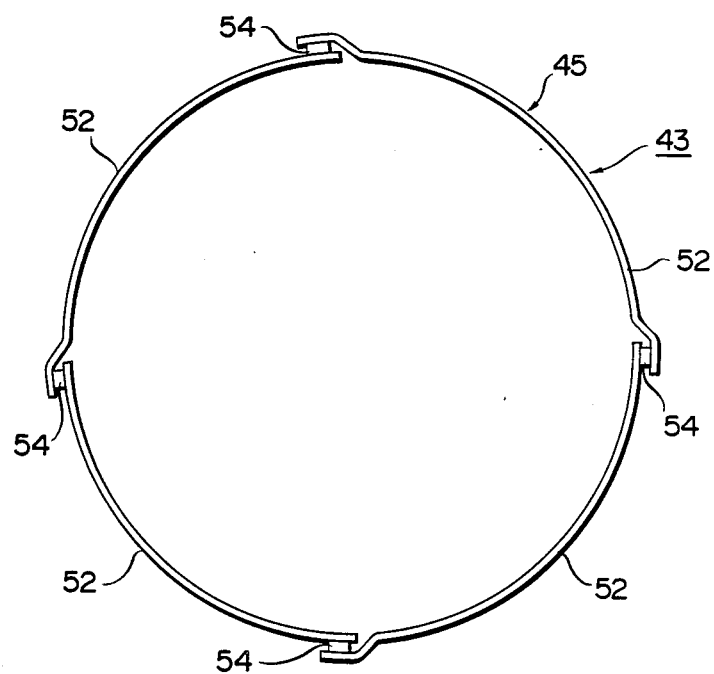

Electromagnetic coupling prevention member 43 is not limited to the structure having slits 46, and may alternatively be constructed so that four sheets of copper foil 52 are coupled in the form of a cylinder, with their ends successively overlapping one another, and that insulating members 54 are interposed between the ends of sheets 52, as shown in FIG. 8. In this case, copper foil sheets 52 constitute high-conductivity portions 44, while insulating members 54 serve as electrically discontinuous portions 46. With this arrangement, high-frequency waves can securely be prevented from leaking out during the detection of magnetic resonance signals at even 7 MHz or more. In this case, moreover, foil sheets 52 are electrically connected at one end side by means of, for example, conductor wires.

In the embodiment described above, the probe heads for transmission and reception are formed of separate saddle-shaped coils. Alternatively, however, they may be composed of the same saddle-shaped coil.

What is claimed is:

1. A magnetic resonance imaging apparatus which forms an image of the spin density distribution associated with relaxation time information within a subject by utilizing a magnetic resonance effect, comprising:
   probe head means for applying a high-frequency magnetic field to the subject and receiving magnetic resonance signals from said subject;

inclined magnetic field coil means for generating and applying an inclined magnetic field to the subject, so that the magnetic resonance signals detected by the probe head means provide spatial information; and an electromagnetic coupling prevention member for preventing electromagnetic coupling between the probe head means and the inclined magnetic field coil means, said prevention member including a plurality of grounded sheet-like copper foils, coupled to one another in a cylindrical form such that their radial ends overlap one another; and an insulating member interposed between the overlapping ends of the copper foils.

2. The magnetic resonance imaging apparatus according to claim 1, wherein said probe head means includes a transmission probe head for applying the high-frequency magnetic field to the subject, and a reception probe head for receiving the magnetic resonance signals from the subject, and wherein said transmission and reception probe heads are each formed of a saddle-shaped coil.

3. The magnetic resonance imaging apparatus according to claim 1, wherein said inclined magnetic field coil means includes a saddle-shaped coil.

4. A magnetic resonance imaging apparatus which forms an image of the spin density distribution associated with relaxation time information within a subject by utilizing a magnetic resonance effect, comprising:

probe head means for applying a high-frequency magnetic field to the subject and receiving magnetic resonance signals from said subject;

inclined magnetic field coil means for generating and applying an inclined magnetic field to the subject, so that the magnetic resonance signals detected by the probe head means provide spatial information; and an electromagnetic coupling prevention member for preventing electromagnetic coupling between the probe head means and the inclined magnetic field coil means, said prevention member including a plurality of high-conductivity portions and a plurality of electrically discontinuous portions electrically separating the high-conductivity portions from one another, wherein said electromagnetic coupling prevention member includes an electrical coupling portion for electrically connecting the high-conductivity; and wherein said electomagnetic coupling prevention member further includes a substantially cylindrical body having a plurality of slits extending from one end of the body close to the other end, said slits constituting the electrically discontinuous portions, so that the high-conductivity portions are formed at that part of the body divided by the slits, and the electrical coupling portion is formed at the remaining part of the body not divided by the slits.

* * * * *